(12) United States Patent
Bernstein et al.

(10) Patent No.: US 6,326,666 B1
(45) Date of Patent: Dec. 4, 2001

(54) DTCMOS CIRCUIT HAVING IMPROVED SPEED

(75) Inventors: Kerry Bernstein; Norman J. Rohrer, both of Underhill, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/534,902

(22) Filed: Mar. 23, 2000

(51) Int. Cl.⁷ .................................................. H01L 27/01
(52) U.S. Cl. .................... 257/347; 257/369; 257/401; 257/391; 257/393
(58) Field of Search .................................. 257/347, 369, 257/401, 391, 393

(56) References Cited

U.S. PATENT DOCUMENTS

| | | | |
|---|---|---|---|
| 3,737,673 | 6/1973 | Suzuki | 307/205 |
| 4,122,360 | 10/1978 | Kawagai et al. | 307/205 |
| 5,461,330 | 10/1995 | Gist et al. | 326/17 |
| 5,465,054 | 11/1995 | Erhart | 326/34 |
| 5,467,048 | 11/1995 | Watanabe | 327/436 |
| 5,514,982 | 5/1996 | Hall et al. | 326/83 |
| 5,559,368 | 9/1996 | Hu et al. | 257/369 |
| 5,583,454 | 12/1996 | Hawkins et al. | 326/81 |
| 5,729,155 | 3/1998 | Kobatake | 326/68 |
| 5,748,029 | 5/1998 | Tomasini et al. | 327/389 |
| 6,064,263 | * 5/2000 | Nowak | 257/347 |

* cited by examiner

*Primary Examiner*—Edward Wojciechowicz
(74) *Attorney, Agent, or Firm*—Connolly Bove Lodge & Hutz

(57) ABSTRACT

A DTCMOS circuit produces an output based on a logical combination of input logic signals. The circuit includes input transistors which receive on a respective gate a respective logic signal. The transistors have a body contact which is connected to the gate of another transistor. Transistors which are receiving later arriving logic signals therefore have a threshold voltage lowered by an earlier arriving logic signal. By coupling the earlier arriving logic signal with a body contact of another input transistor, the threshold voltage may be lowered prior to processing of the subsequently arriving logic signal. The DTCMOS circuit may be implemented in SOI with the attendant benefits of a lower supply made possible by the lowered voltage threshold each of the transistors without sacrificing leakage current inherent in DTCMOS circuits.

9 Claims, 2 Drawing Sheets

US 6,326,666 B1

DTCMOS CIRCUIT HAVING IMPROVED SPEED

BACKGROUND OF THE INVENTION

The present invention relates to DTCMOS circuits which are implemented in SOI. Specifically, a circuit is described having a plurality of input transistors whose threshold voltage is controlled by an early arriving logic input signal.

Dynamic threshold metal oxide semiconductor (DTMOS) devices can be fabricated on silicon-on insulator (SOI) substrates as described, for instance in U.S. Pat. No. 5,559,368. The SOI environment has offered the promise of reducing device sizes to the submicron gate level. The MOSFET devices are fabricated using a layer of semiconductor material deposited over an insulation layer of a supporting bulk wafer. The resulting structure includes a film of monocrystalline silicon on a buried layer of silicon oxide. The bulk silicon material from which the channel of the MOSFET device is formed is either grounded, or in many applications connected to the source region of the device. In accordance with the application described in the aforesaid referenced patent, the MOSFET device monocrystalline silicon film is connected to the gate of the MOSFET device to reduce the turn-on voltage ($V_t$) when the gate voltage is high. The reduced threshold voltage $V_t$ for the device improves its performance in numerous respects. When the FET is OFF, the threshold voltage is increased reducing subthreshold leakage currents.

Applications which use DTCMOS devices provide not only the advantage of lower leakage currents while the MOSFET device is off, and lower threshold voltages when the device is on, but may also improve the speed of circuits utilizing MOSFET. The present invention is directed to one such application for improving the speed of DTCMOS logic circuits.

SUMMARY OF THE INVENTION

A DTCMOS circuit is implemented in SOI technology to perform a logical combination of input logic signals. The circuit includes a plurality of input transistors which receive on a gate thereof respective logic signals which are to be logically combined. The transistors formed in the SOI technology have a body contact connected to the monocrystalline silicon film of the device. Use is made of the body contact for controlling the voltage threshold $V_t$ of a device which receive a respective logic signal.

In accordance with a preferred embodiment of the invention, an earlier arriving logic signal is coupled to the gate of one input transistor, as well as to the body contact of another transistor receiving a later arriving logic signal. A data transition on the earlier arriving logic signal will lower the voltage threshold of the input transistor receiving the later arriving signal. Thus, a dynamic lowering of the voltage threshold occurs permitting an increase in speed for the logic circuit. The DTCMOS circuit provides for the usual advantages of lower voltage thresholds and reduced power supply voltage requirements, as well as improves the speed for the circuit due to the lowering of the voltage threshold on input transistors which receive later arriving logic signals.

DESCRIPTION OF THE INVENTION

Figure 1:
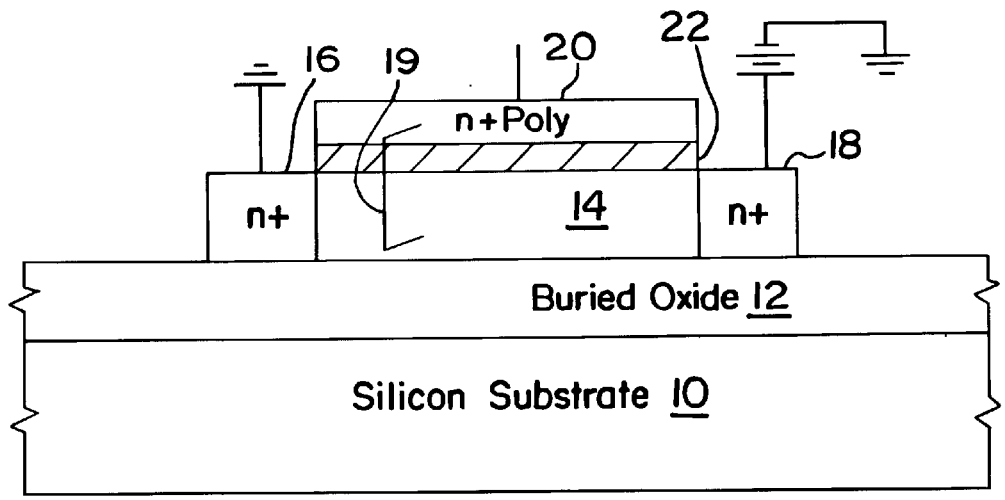
FIG. 1 is an illustration of a DTCMOSFET implemented in SOI technology.

FIG. 1 illustrates a cross-section of an SOI MOSFET having a body contact connected to the silicon 14. The DTCMOS NFET is fabricated in SOI substrates 10 having a buried oxide layer 12 formed therein with a p-silicon film 14 on the buried oxide layer 12. An n-source region 16 is provided, as well as a drain region 18. A gate 20 is formed over the gate insulation 22. A body connection 19 is made between the gate 20 and body 14 permitting the body potential to be controlled in response to an applied gate voltage.

Figure 2:
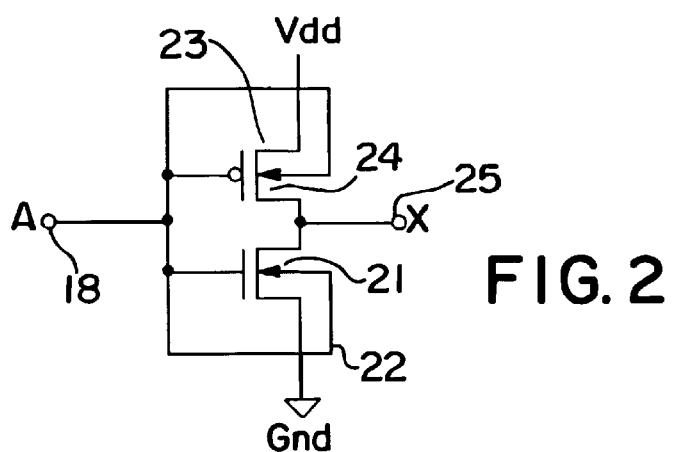
FIG. 2 illustrates a prior art DTCMOS inverter having gates tied to the body of each FET device.
Figure 3:
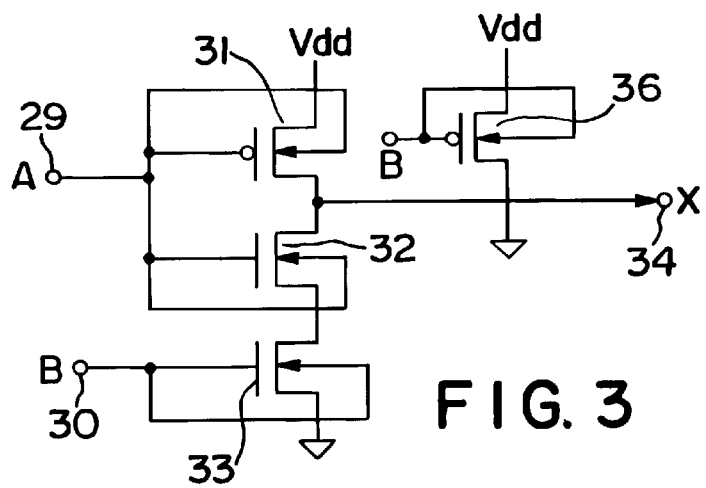
FIG. 3 illustrates a DTCMOS NAND gate.

As is known from the prior art, the gate and body connection are connected together as is shown in FIGS. 2 and 3. The inverter circuit of FIG. 2 has a lower threshold voltage $V_t$ for each of the transistors 23 and 21 because the NFET 21 and PFET 23 have body contacts 22 and 24 connected to the gates of the respective device. A signal A applied to input 18 produces an inverted level represented by the voltage X at output 25. The foregoing arrangement reduces the threshold ($V_t$) for each of the transistors 21, 23, when the FET is conducting.

The foregoing principles of the prior art are also applied in a two-input NAND gate shown in FIG. 3. The NAND gate includes a stack of transistors 32 and 33 serially connected so that the drain and sources of each transistor are connected in series with the output 34. Transistor 31 is a PMOS transistor in parallel with PMOS transistor 36. The body connections for each of the transistors are connected to their respective gates. Logic signals A and B are applied to input terminals 29 and 30, as well as to the gate of transistor 36.

The NAND gate of FIG. 3 provides an output voltage X when input signals A and B are at a low, zero level. The circuit also has the advantage of a reduced $V_t$ for each of the transistors, thereby improving the overall circuit speed.

Figure 4:
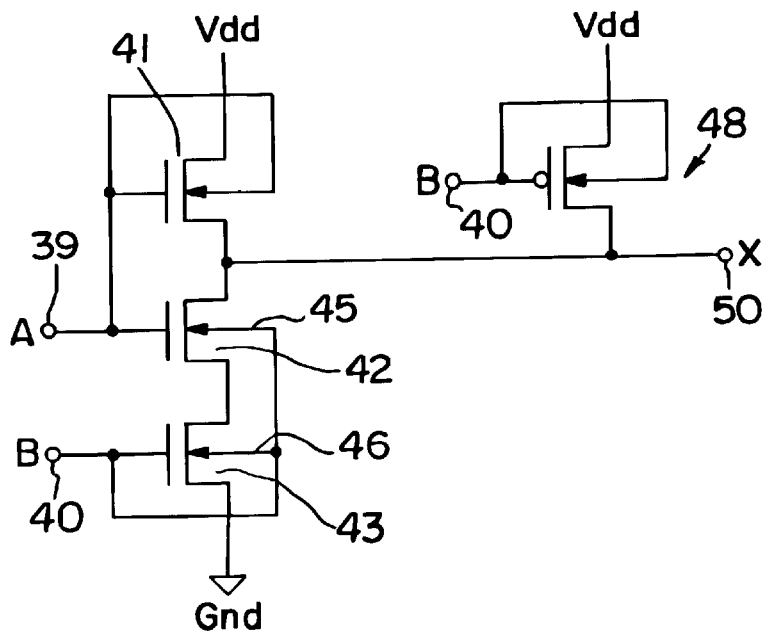
FIG. 4 illustrates a first embodiment of the invention which provides for a two-input NAND gate in accordance with the invention.

FIG. 4 represents a first embodiment of the invention, wherein the body potential of a transistor is controlled by the input signal of an adjacent transistor. Transistors 41, 42 and 43 are connected in a stack, source to drain, and the stack is in turn connected across the terminals of power supply Vdd. Logic signals A and B are applied to input terminals 39 and 40, as well as to the gate of PMOS transistor 48. Output terminal 50 provides a signal X which is the logical combination produced by a NAND gate.

The circuit of FIG. 4 includes a transistor 42 in the stack of transistors having a body contact 45 which is connected to the gate of transistor 43. The aforesaid connection permits the body of transistor 42 to be set at a high potential when logic signal B goes high. In this way, if logic signal B arrives ahead of logic signal A, the threshold $V_t$ of transistor 42 will have been lowered and transistor 42 will otherwise turn on sooner than had body contact 45 been connected to its gate. Accordingly, with the foregoing arrangement, when logic signal B is low, a higher threshold voltage is maintained on transistor 42 providing enhanced noise immunity, and reduced leakage currents. However, when the logic signal B goes to a high value, the threshold voltage for transistor 42 will be lowered.

Figure 5:
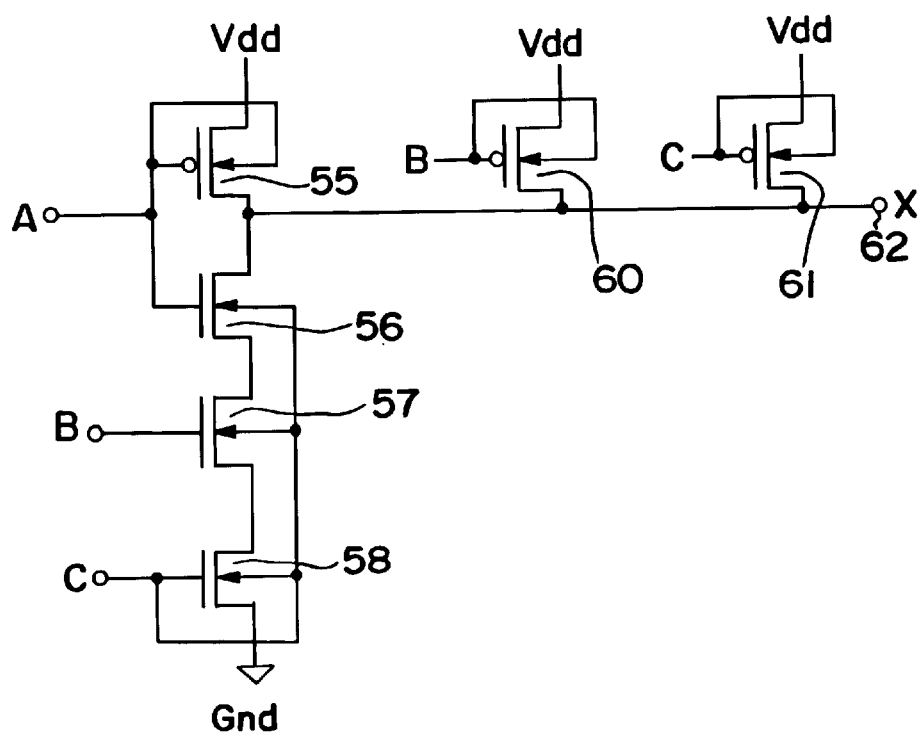
FIG. 5 illustrates a three-input NAND gate in accordance with a second embodiment of the invention.

The same principle may be applied to the three-input NAND gate shown in FIG. 5. Input terminals 51, 52 and 53 receive logic signals A, B and C. Additionally, PMOS transistors 60 and 61 receive logic signals B and C as well. An output terminal 62 provides the logical output of the NAND function for input signals A, B and C.

As is illustrated in FIG. 5, the body contact of transistors 56, 57 and 58 is connected to the input terminal 53. Each of these NFET devices when receiving a logic signal C provide a lower threshold voltage for the respective transistors 56, 57 and 58. Thus, if signals A and B arrive later than signal C, the threshold values for transistors 56 and 57 have already been reduced, effectively speeding up the generation of an output signal on terminal 62. The lower voltage thresholds on each of the transistors means also that the power supply voltage Vdd may be correspondingly reduced as is beneficial in DTCMOS circuitry.

The foregoing description of the invention illustrates and describes the present invention. Additionally, the disclosure shows and describes only the preferred embodiments of the invention, but as aforementioned, it is to be understood that the invention is capable of use in various other combinations, modifications, and environments and is capable of changes or modifications within the scope of the inventive concept as expressed herein, commensurate with the above teachings, and/or the skill or knowledge of the relevant art. The embodiments described hereinabove are further intended to explain best modes known of practicing the invention and to enable others skilled in the art to utilize the invention in such, or other, embodiments such as for NOR gates, AND gates, tribuffers, etc., and with the various modifications required by the particular applications or uses of the invention. Accordingly, the description is not intended to limit the invention to the form disclosed herein. Also, it is intended that the appended claims be construed to include alternative embodiments.

What is claimed is:

1. A logic circuit comprising:

a plurality of inputs for receiving individual logic signals;

DTCMOS circuit connected to receive said inputs and to provide an output which is the logical combination of said logic signals, said circuit having a plurality of input transistors which receive on a gate thereof respective logic signals, at least one of said transistors having a body contact connected to a gate of another transistor, whereby said at least one transistor which receive a later arriving logic signal has a threshold voltage lowered by an earlier arriving logic signal which is received on its body contact.

2. The logic circuit according to claim 1 wherein said input transistors are connected in a stack.

3. The logic circuit according to claim 2 wherein said input transistors have source drain connections serially connected together between terminals of a supply voltage.

4. The logic circuit according to claim 3 comprising three input transistors and an transistor having a source drain connection connected between a junction of a source and drain of two of said input transistors and to a terminal of said supply voltage, and having a gate connected to a gate of one of said input transistors.

5. The logic circuit according to claim 4 wherein said input transistor has a body contact connected to its gate.

6. A DTCMOS logic circuit for implementing a NAND function comprising:

first, second and third transistors having a gate connected to receive first, second and third logic signals, respectively, and having a body contact connected to receive said third logic signal, said transistors having serially connected drain-source connections;

a fourth transistor serially connecting said first, second and third transistors to a voltage supply; and fifth and sixth transistors having gate connections connected to receive said second and third logic signals and having a source-drain connection connected in parallel with said fourth transistor source-drain connection forming an output node for said logic circuit.

7. A method for increasing the speed of DTCMOS logic circuits comprising:

connecting logic signals to gates of an input transistors, each of said input transistors having a body contact; and coupling an earlier arriving logic signal to a body of an input transistor receiving a later arriving logic signal; whereby the transistor receiving a later arriving signal has a lower threshold voltage.

8. The method according to clam 6 further comprising coupling the earliest arriving signal to the body contact of an additional transistor receiving an additional later arriving signal.

9. The method according to claim 6 further comprising connecting said input transistors in a stack to form a logic circuit for producing an output signal which is a logical combination of said logic signals.

* * * * *